United States Patent [19]

Krivoshlykov

[11] Patent Number: 5,909,614

[45] Date of Patent: Jun. 1, 1999

[54] METHOD OF IMPROVING PERFORMANCE OF SEMICONDUCTOR LIGHT EMITTING DEVICE

[76] Inventor: Sergei G. Krivoshlykov, 48 Briarwood La., apt 12, Marlborough, Mass. 01752

[21] Appl. No.: 08/987,120

[22] Filed: Dec. 8, 1997

[51] Int. Cl.[6] .................................................. H01L 21/02
[52] U.S. Cl. .............................. 438/29; 438/45; 438/46; 438/47; 438/962
[58] Field of Search ................................ 438/29, 31, 32, 438/45, 46, 47, 962; 257/14, 22

[56] References Cited

U.S. PATENT DOCUMENTS

| | | |
|---|---|---|
| 5,281,543 | 1/1994 | Fukuzawa et al. . |
| 5,348,687 | 9/1994 | Beck et al. . |
| 5,452,123 | 9/1995 | Asher et al. . |
| 5,747,180 | 5/1998 | Miller et al. . |
| 5,783,498 | 7/1998 | Dotta . |

*Primary Examiner*—Charles Bowers
*Assistant Examiner*—Keith Christianson

[57] ABSTRACT

A modification process of formation of microscopic clusters (quantum dots) in a semiconductor material and changing refractive index in the near-surface region of the material is used for improving performance of different semiconductor light emitting devices. The clusters formation directly in an active region of a semiconductor laser diode results in increasing its power, slope efficiency and decreasing threshold current. Changing the refractive index distribution along active and passive regions of the semiconductor material enables fabrication of uniform or non-uniform waveguide structures along a laser diode cavity and optical isolation of individual emitters in a laser diode array. Modification of the refractive index in the vicinity of laser mirrors allows efficient control of reflection from laser mirrors. The modification can be used instead of mirror coating resulting in considerable increasing the laser diode power and decreasing threshold current. Enhancement of the third order nonlinearity in a semiconductor material after its modification is useful for performing different all-optical functions. The method can be applied to many semiconductor based active and passive integrated optical and photonic devices, including diode lasers, diode laser bars and arrays, vertical cavity surface emitting lasers (VCSELs), and light emitting diodes. It is useful in all applications where highly efficient diode lasers are required, including high-power laser diode systems for pumping solid state lasers, industrial cutting and welding and different medical procedures.

20 Claims, 10 Drawing Sheets

METHOD OF IMPROVING PERFORMANCE OF SEMICONDUCTOR LIGHT EMITTING DEVICE

BACKGROUND OF THE INVENTION

1. Field of the Invention

The present invention relates to integrated optical semiconductor light emitting devices, such as semiconductor laser diodes, arrays and light emitting diodes, and, in particular, to a new method of improving performance of the light emitting devices by modification of their material including increasing power, slope efficiency, thermal stability and decreasing threshold current and linewidth enhancement factor. The modification of the laser material improves performance of the semiconductor light emitting device by creating clusters (quantum dots) in its active or passive regions improving efficiency of the lasing material and changing its refractive index.

In one preferred embodiment, the change in refractive index as a result of the modification process is used to fabricate a longitudinally inhomogeneous waveguide structure along the active light emitting device in order to expand the beam preventing its self-focusing, to increase output power and to make the beam almost diffraction limited. In another preferred embodiment, the change in refractive index is used to isolate individual active elements of a diode laser array in order to suppress amplified spontaneous emission in the lateral dimension.

The method can be used in all applications where highly efficient diode lasers, diode laser arrays or light emitting diodes are required, including high-power laser diode systems for pumping solid state lasers, industrial cutting and welding and different medical procedures including photo-dynamic therapy.

2. Information Disclosure Statement

Semiconductor laser technology offers the most efficient and flexible means for generating coherent laser radiation at different wavelengths. It has the potential to replace, in the future, large inefficient and expensive laser systems in many industrial, scientific, medical and military applications. The benefits of semiconductor laser diodes include less expensive, more efficient and more compact laser delivery systems with substantial output power.

Many laser delivery systems use compact and inexpensive laser diodes or diode laser arrays as a source of coherent radiation. Combination of high brightness beams delivered by optical fibers from individual laser diodes would provide a flexible means for generating powerful output beams at various frequencies. Semiconductor technology has the potential to provide wavelengths in the visible to middle infrared regions at powers over 70 watts by combining beams from individual lasers. Therefore semiconductor lasers may successfully replace different lasers currently used in many industrial, medical and scientific applications.

Improving performance of the semiconductor lasers and reducing price per watt of delivered power is a critical problem to be solved for all applications. High brightness beam generated by diode lasers or diode laser arrays is required, for example, in different diode pumped solid state laser systems, laser radars, systems of free space laser communication, industrial cutting and welding and systems for various medical surgery, diagnostic and treatment, including photo-dynamic therapy.

In order to improve power, slope efficiency and thermal stability of the laser diodes and laser diode systems, and reduce their threshold current and linewidth enhancement factor, new active laser materials should be designed. At the beginning of the development of laser diode technology researchers used heterostructures (sandwiches created by alternating layers of two materials with different conductive properties) to reduce the movement of electrons and improve the laser performance. By further limiting the carriers, creating a multiple quantum wells (MQW) structure in the active region of the laser diode or laser diode array, researchers increased efficiency and thermal stability of diode lasers while reducing threshold currents. One of the most efficient method of further improving laser diode performance is creating microscopic quantum wires or three-dimensional clusters (quantum dots) in the active region of the semiconductor device. Fabrication of efficient quantum dot materials would revolutionize the laser diode technology leading to highly efficient threshold-less semiconductor laser emitters.

Today, the uniform island of high-quality semiconductors on the nanoscale can be created using highly strained semiconductors and standard, self-assembling deposition technique such as molecular beam epitaxy. By carefully choosing semiconductor material, one can create quantum dot structures capable of emitting visible light by using AlInAs/AlGaAs or infrared emissions using InGaAs/GaAs.

The present invention suggests new approach to improving performance of the semiconductor light emitting devices. It is based on a new method of modification of the device semiconductor material creating microscopic clusters (quantum dots) and changing refractive index of the material. The modification of semiconductor material is caused by a drift of intrinsic defects to the surface of semiconductor, in particular, by drift of the interstitial Ga atoms in GaAs crystal in the electric field induced by a near-surface band bending due to adsorption of appropriate dopants. On achieving the limit of solubility for the concentration of interstitial material in crystal, it forms clusters (quantum dots) which drastically change properties of the semiconductor material in its near-surface region. The creation of quantum dots in active semiconductor region increases power and slope efficiency of the semiconductor light emitting device, reduces its threshold current and linewidth enhancement factor, improves electrical efficiency of the system, simplifies heat sink requirements and increases the system lifetime and performance.

Moreover, extremely large index variation in the semiconductor material can be achieved as a result of the cluster formation. This provides a unique possibility for low cost fabrication of a broad class of semiconductor based active or passive diffractive optical elements. In one preferred embodiment, the cluster formation and index variation can be supported by illumination of the semiconductor material with the light beam at the fundamental absorption wavelength in presence of highly polar liquid having appropriate dopants dissolved in it. This provides a possibility of simple fabrication of the semiconductor based active or passive diffractive optical elements using simple process of direct laser beam writing.

U.S. patent application Ser. No. 08/749,814 describes a method of self-correction of the laser diode beam by creating a gradient index micro-lens near the output mirror of the laser diode employing the process of modification of refractive index under the influence of laser beam. The present invention, however, describes the more general process of modification of the semiconductor material and different applications of the process to improving the laser performance, particularly, by modifying the semiconductor material along the laser cavity.

In one preferred embodiment, the modification is employed to create quantum dots directly in active region of the semiconductor light emitting device, considerably improving its performance by increasing power, slope efficiency and decreasing threshold current.

In another preferred embodiment, the modification is used to control the refractive index distribution along active and passive regions of the semiconductor material in order to fabricate a longitudinally inhomogeneous waveguide structure along the laser device or isolate individual emitters in a laser diode array. Moreover, the process of modification of the refractive index in the vicinity of laser mirrors can be used instead of coating for controlling reflection from the mirrors. This also results in considerable increasing in the laser power and decreasing the laser threshold current.

The proposed method can be applied to all semiconductor based light emitting devices including standard horizontal cavity diode lasers, bars, arrays, VCSELs (vertical cavity surface emitting lasers) and also light emitting diodes.

OBJECTS AND SUMMARY OF THE INVENTION

It is an object of the present invention to improve performance of semiconductor light emitting devices by modifying their materials in the active or/and passive cladding region.

Another object of the invention is to provide a simple and efficient method of modification of semiconductor materials in their near-surface region by creating clusters (quantum dots) and obtaining large change in the refractive index.

Another object is to provide an efficient method of increasing power and slope efficiency of the semiconductor light emitting devices.

A further object is to reduce threshold current of the semiconductor light emitting devices.

A further object is to improve thermal stability of the semiconductor light emitting devices.

Still another object of the invention is to reduce linewidth enhancement factor of the semiconductor light emitting devices and increase their catastrophic optical damage threshold and saturation power.

An additional object of the invention is to provide an efficient method for fabrication of various uniform and nonuniform waveguide structures along active semiconductor light emitting devices.

Another object is to create conditions for automatic self-correction of the laser beam reducing its angular divergence and astigmatism.

Still another object is to create regions with enhanced third order nonlinearity in the semiconductor based light emitting and passive optical devices required for different all-optical functions.

Another object of the present invention is to provide an efficient method for optical isolation of individual light emitters in laser diode bars or arrays suppressing amplified spontaneous emission in the lateral dimension.

Briefly stated, the present invention provides a method of improving performance of different semiconductor light emitting devices, including diode lasers, diode laser bars and arrays, vertical cavity surface emitting lasers (VCSELs) and light emitting diodes. The method is based on modification of the semiconductor material of the light emitting device to create microscopic clusters (quantum dots) and change its refractive index in the near-surface region. In one preferred embodiment, the modification is employed to create clusters directly in active region of the semiconductor light emitting device, considerably improving its performance by increasing power, slope efficiency and decreasing threshold current. In another preferred embodiment, the modification is used to control the refractive index distribution along active and passive regions of the semiconductor material in order to fabricate a uniform or non-uniform waveguide structure along the laser device or optically isolate individual emitters in a laser diode array. Moreover, the process of modification of the refractive index in the vicinity of laser mirrors can be used instead of coating for controlling reflection from the mirrors. This also can result in considerably increasing the laser power and decreasing the laser threshold current.

The method proposed can be applied to standard horizontal cavity diodes, to vertical cavity surface emitting lasers (VCSELs), as well as to many other semiconductor-based active and passive integrated optical and photonic devices. The method can be used in all applications where highly efficient diode lasers, diode laser arrays or light emitting diodes are required, including high-power laser diode systems for pump of solid state lasers, industrial cutting and welding and different medical procedures including photodynamic therapy.

The above, and other objects, features and advantages of the present invitation will become apparent from the following description read in conjunction with the accompanying drawings.

DESCRIPTION OF PREFERRED EMBODIMENTS

Performance of light emitting devices strongly depends on quantum structure of their material and also on waveguiding properties of the light emitting system.

If the size of a semiconductor is reduced to a nanometer scale, carriers trapped inside automatically have quantized energy levels. While carriers are free to move in both directions of the plane inside quantum wells, quantum dot structures only support discrete energy levels similar to an artificial atom. Consequently, the density of states created by quantum dots concentrates carriers in states that easily lead to lasing. As long as carriers relax to the ground state, every injected electron in the active region operates at the lasing wavelength. Therefore, quantum dot lasers should have higher differential gain and lower thresholds.

In a quantum dot, excess energy lifts an electron to an available excited state instead of being released as kinetic energy through random motion in a two-dimensional case of quantum wells. Consequently, carriers in quantum dots are less affected by the thermal energies that distribute carriers in quantum wells and lead to broad tunable emissions with lower efficiencies. In addition to remarkably low thresholds, quantum dot lasers will have extremely high electrical-to-optical efficiencies and slope efficiency.

Moreover, creation of microscopic clusters in semiconductor materials can drastically change their refractive index. This offers a new tool for control of the refractive index distribution in the semiconductor based devices and fabrication of different active and passive integrated optical waveguide structures along these active devices improving their performance. Typical example of such improvement is increasing of the laser power and catastrophic optical damage threshold by expanding the beam in a tapering waveguide structure. This method of the performance improvements is successfully demonstrated in MOPA (master oscillator power amplifier) devices.

A typical laser diode can be grown by molecular beam epitaxy or by metallo-organic chemical vapor deposition on GaAs n-doped substrate. Usually, its performance cannot be improved after the process is completed, unless feedback gratings or special coatings on the laser mirrors are used. The present invention suggests a new approach to the improving performance of the semiconductor light emitting devices after their fabrication. It is based on a new method of modification of the device semiconductor material creating quantum dots and changing the refractive index of the material.

Figure 1:
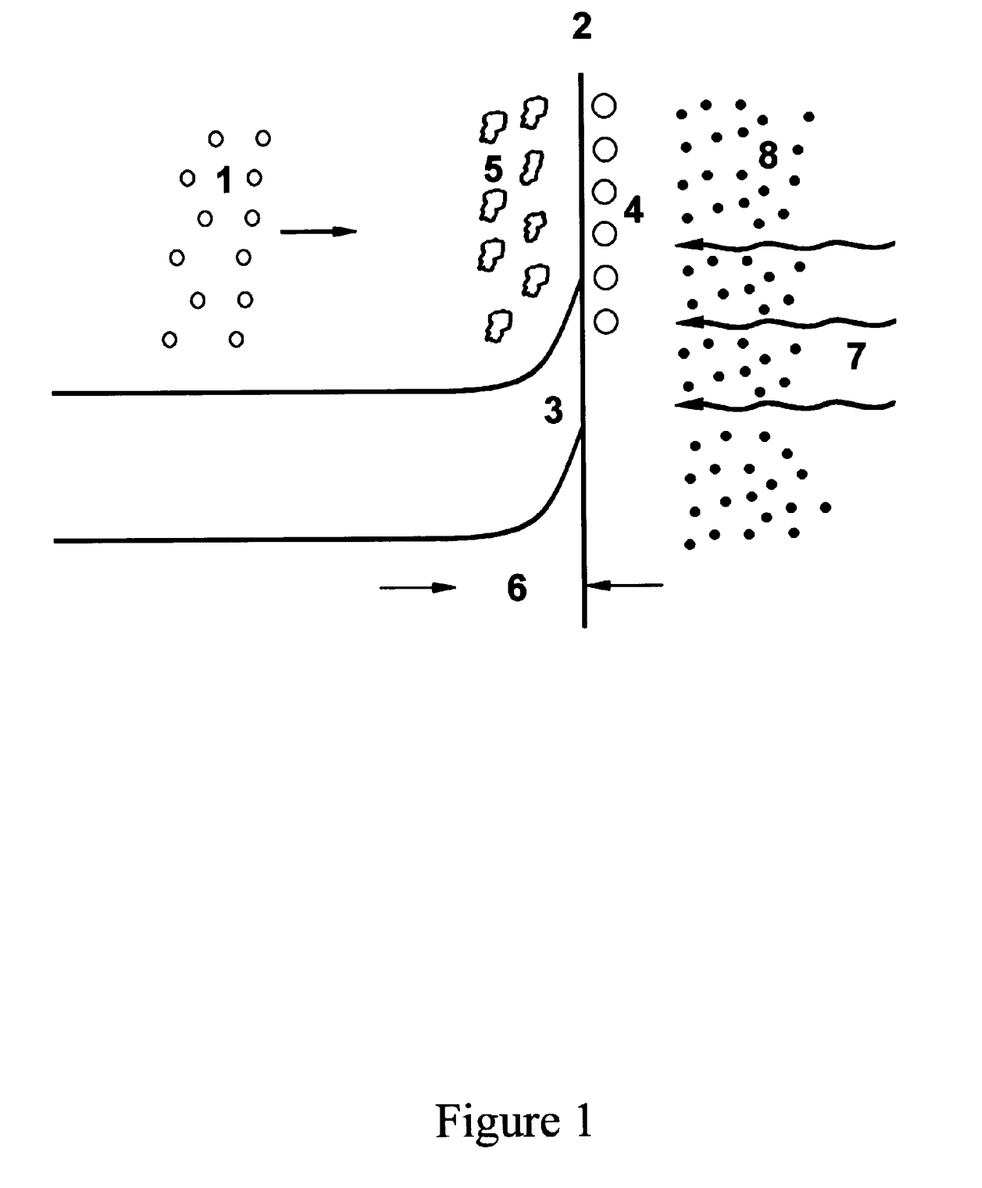
FIG. 1 schematically illustrates a process of modification of a semiconductor material.

The modification of semiconductor material is illustrated in FIG. 1. It is caused by a drift of intrinsic defects 1 to the surface of semiconductor 2, in particular, by drift of the interstitial Ga atoms in GaAs crystal in the electric field induced by a near-surface band bending 3, enhanced due to adsorption of appropriate dopants 4. On achieving the limit of solubility for the concentration of interstitial material in crystal, it forms clusters (quantum dots) 5 which drastically change properties of the semiconductor material in its near-surface region 6. The creation of quantum dots in active semiconductor region increases power and slope efficiency of the semiconductor light emitting device, reduces its threshold current and linewidth enhancement factor, improves electrical efficiency of the system, simplifies heat sink requirements and increases the system lifetime and performance.

When semiconductor is cleaved, a set of unsaturated bonds appears at the exposed surface. These bonds are available for strong interactions with atoms and molecules of the ambient. Surface states appear which can either give or receive electrons, thus connecting the ambient to the crystal. These surface states are known as Tamm states.

As a result of the surface states, energy bands 3 are usually bent near surface 2. If the surface state can trap an electron, it acts as an acceptor, and the bands bend upward at the surface. If the donor-like trap can lose an electron, forming a positive charge at the surface, it will cause the bands to bend down. If the approaching gas atom or molecule 4 has a greater electron affinity than the work function of the semiconductor, it may capture an electron from the surface and, thus behaving as an acceptor, will tend to bend the bands upwards. For example, oxygen, which is very electronegative, causes an upward bending of the bands. Therefore, using an appropriate dopant one can dramatically enhance the process of near-surface band bending.

Illumination of the semiconductor surface with light 7 at the fundamental absorption wavelength also assists the process making more electrons in the conductive band available for the process of modification. In one preferred embodiment, the cluster formation and index variation can be supported by illumination of the semiconductor material with the light beam at the fundamental absorption wavelength in presence of highly polar liquid 8 having appropriate dopants 4 dissolved in it. This provides a possibility of simple fabrication of the semiconductor based active or passive waveguide structures and diffractive optical elements using simple process of direct laser beam writing.

It has been found, that the bending of the bands can result in very large modification of the refractive index of the semiconductor material in the near-surface region. It has been experimentally demonstrated that a semiconductor material being under simultaneous influence of three factors: highly polar medium (for example, water), modifying radiation at fundamental absorption wavelength and appropriate dopants (for example, such acceptors as oxygen, ions of some metals, etc.) dissolved in water exhibits variation of the refractive index in its surface region as large as 0.8–1. This phenomenon has been demonstrated for broad class of biatomic III–V and II–VI semiconductor materials and single-atomic semiconductors crystals including such practically important semiconductors as GaAs, CdS, Si, silver halide, etc.

Clusters 5 are formed under the influence of an electric field of band bending 3 which can penetrate deeply inside the semiconductor material. Therefore, the modified near-surface region 6 can approach thickness of tens of micrometers which is quite sufficient for fabrication of most practically important waveguide structures based on the semiconductor materials. Moreover, the modification process can be used for creation of clusters directly in active region of p-n structure of the semiconductor light emitting device, since this region is usually located close enough to surface 2 of the semiconductor device.

Figure 2:
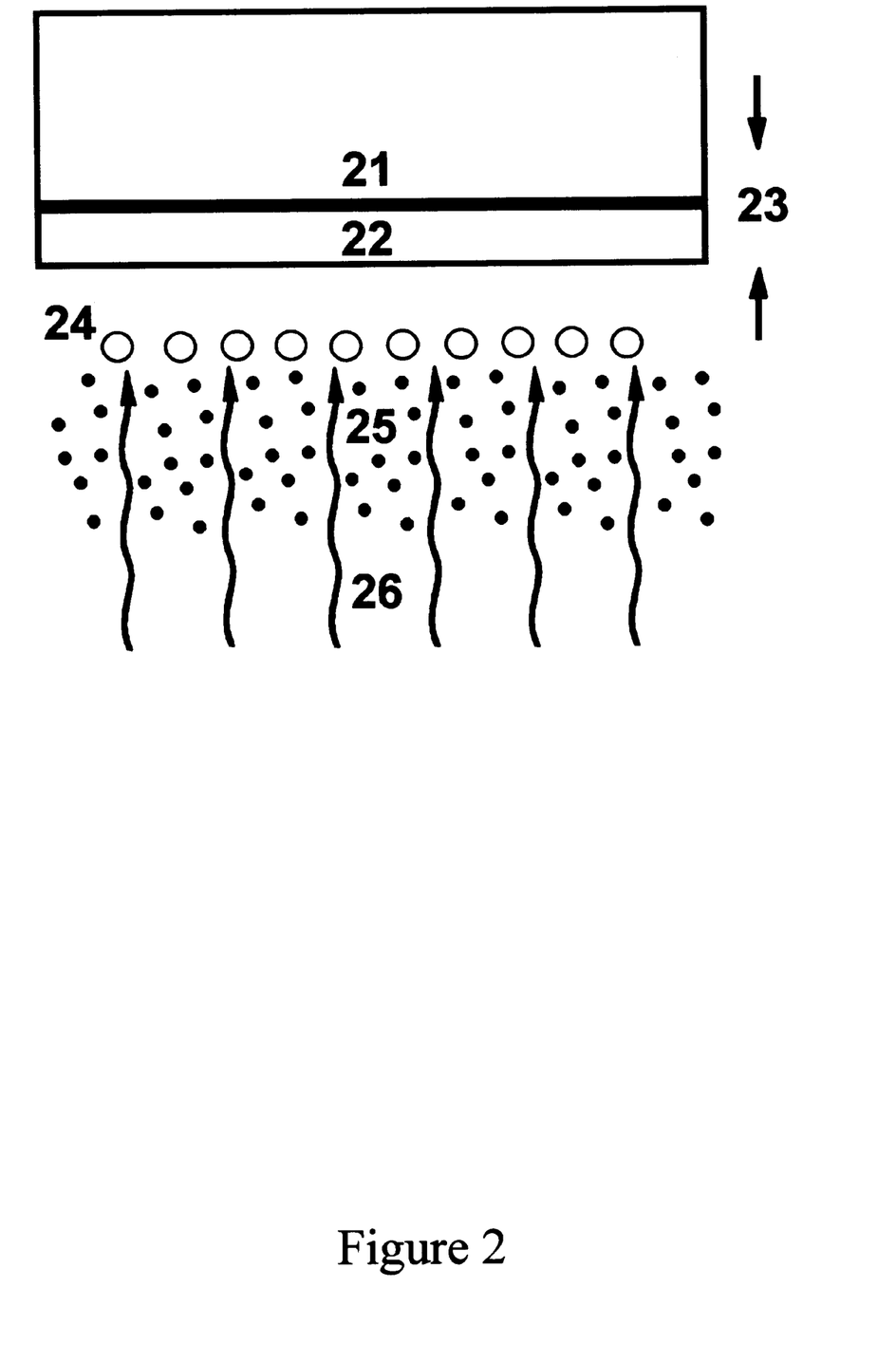
FIG. 2 shows a process of modification of active region of p-n junction in a semiconductor light emitting device.

FIG. 2 shows a preferred embodiment of the present invention where modification is performed in active region of p-n junction 21 along cavity of the semiconductor light emitting device and the active region is located close enough to surface 22 of the device to be inside region of modification 23. In order to perform modification of the light emitting device along its cavity it is necessary to have side surface 22 of the device open to allow dopants 24, polar liquid 25 and light 26 approach the surface. In most semiconductor light emitting devices the surface near active region of p-n junction is usually closed by a heat sink playing also the role of an electrical contact. Therefore, the described modification along the device cavity should be performed before the semiconductor crystal is placed on the heat sink.

Figure 3:
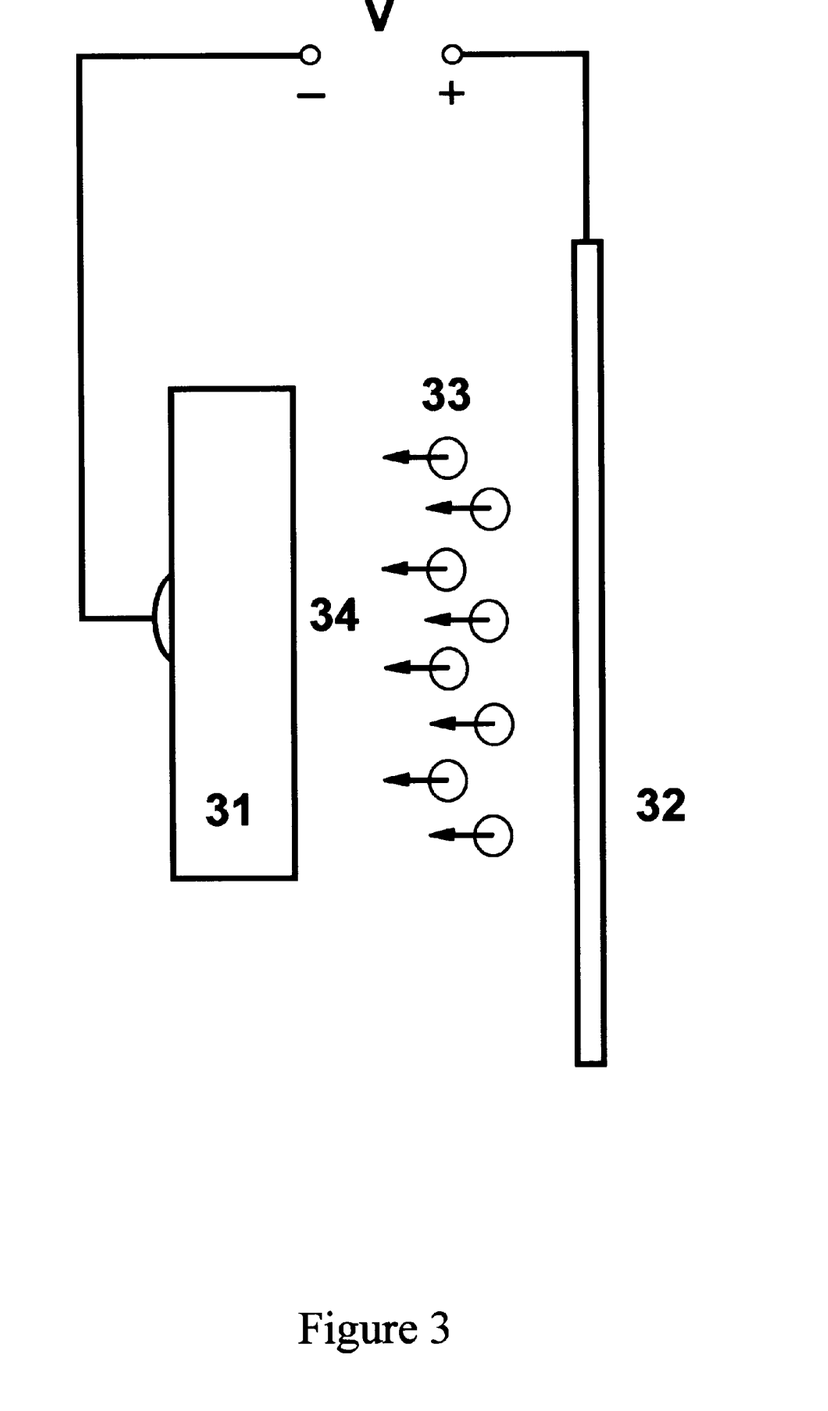
FIG. 3 shows a process of modification assisted by an external electric field.

Application of an external electric field to the surface of semiconductor will help the acceptors to approach the surface assisting the modification process. FIG. 3 shown one preferred embodiment of such an electrical field assisted modification process. Electric voltage V is applied between semiconductor crystal 31 and external electrode 32 to assist dopants 33 in approaching semiconductor surface 34.

Figure 4:
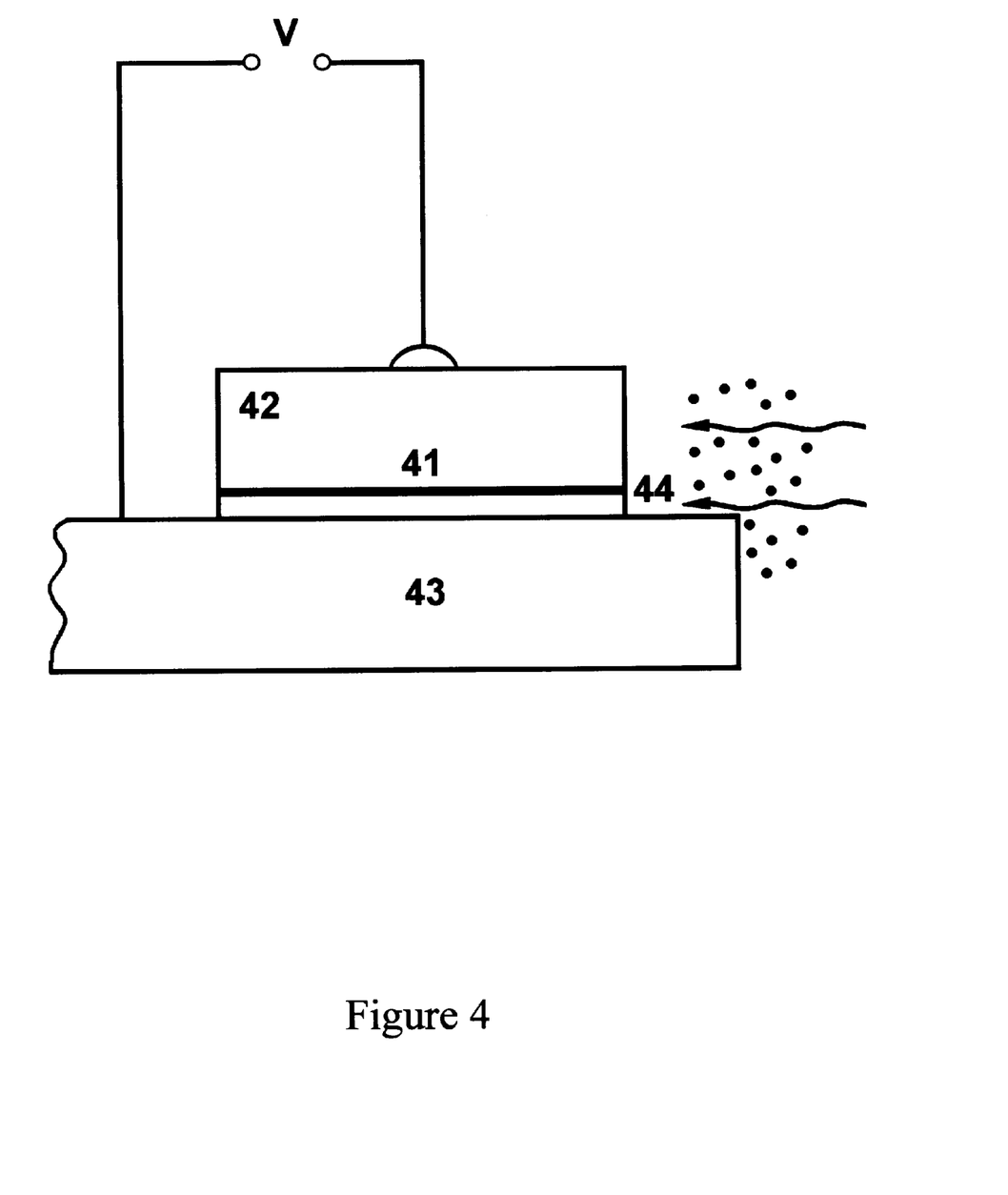
FIG. 4 illustrates controlling the modification process by an electric field applied across the active region of p-n junction.

FIG. 4 shows another preferred embodiment where an electric field is directly applied across active p-n junction region 41 of the light emitting device 42 siting on heat sink/electrode 43. This supplies more electrons to modified active region near output interface 44 enhancing the cluster formation process and allowing its control by changing the applied voltage.

Figure 5:
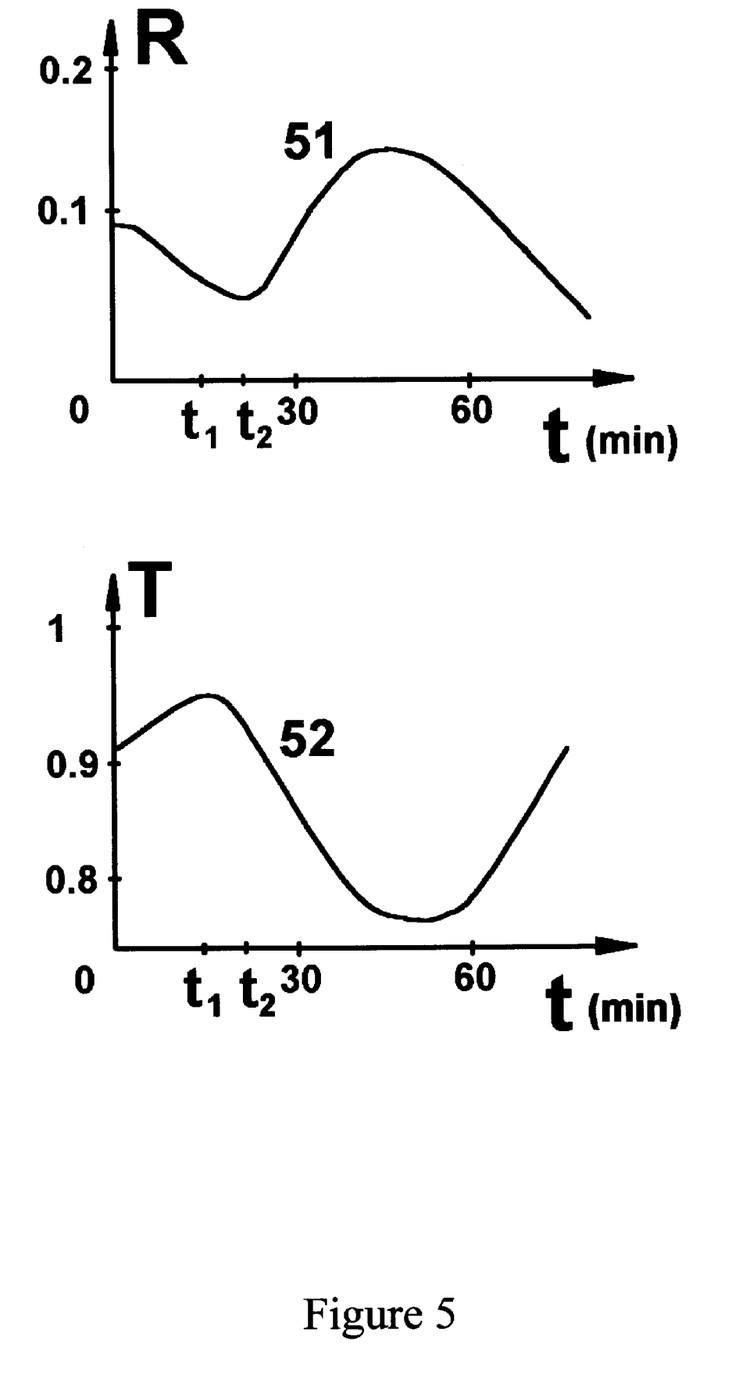
FIG. 5 shows reflection coefficient R and transmission coefficient T as a function of modification time t.

The phenomenon of photo-modification of the refractive index has been first demonstrated for CdS crystal by measuring the reflection from and transmission through the semiconductor. FIG. 5 schematically shows reflection coefficient R and transmission coefficient T as a function of modification time t. It was found that at the beginning of the modification process, during time $t_1$, the reflection coefficient R decreases while the transmission coefficient T increases. During the time interval from $t_1$ to $t_2$ both R and T decrease. After the moment of time $t_2$ the reflection coefficient R increases and then decreases again. Therefore, by proper optimization of the modification process one can achieve large controllable variation of the refractive index in the semiconductor material while its transmission still remains high.

The variation of the refractive index of material during the process of its modification is proportional to intensity of the light. If intensity distribution of the modifying light beam is spatially modulated, then the induced index distribution in the semiconductor material will exactly reproduce this structure. Thus, the refractive index distribution is a picture of the intensity distribution in the modifying beam. The variation of refractive index can be employed for fabrication of a broad class of different active or passive waveguiding and diffractive optical elements based on semiconductor materials.

Figure 6:
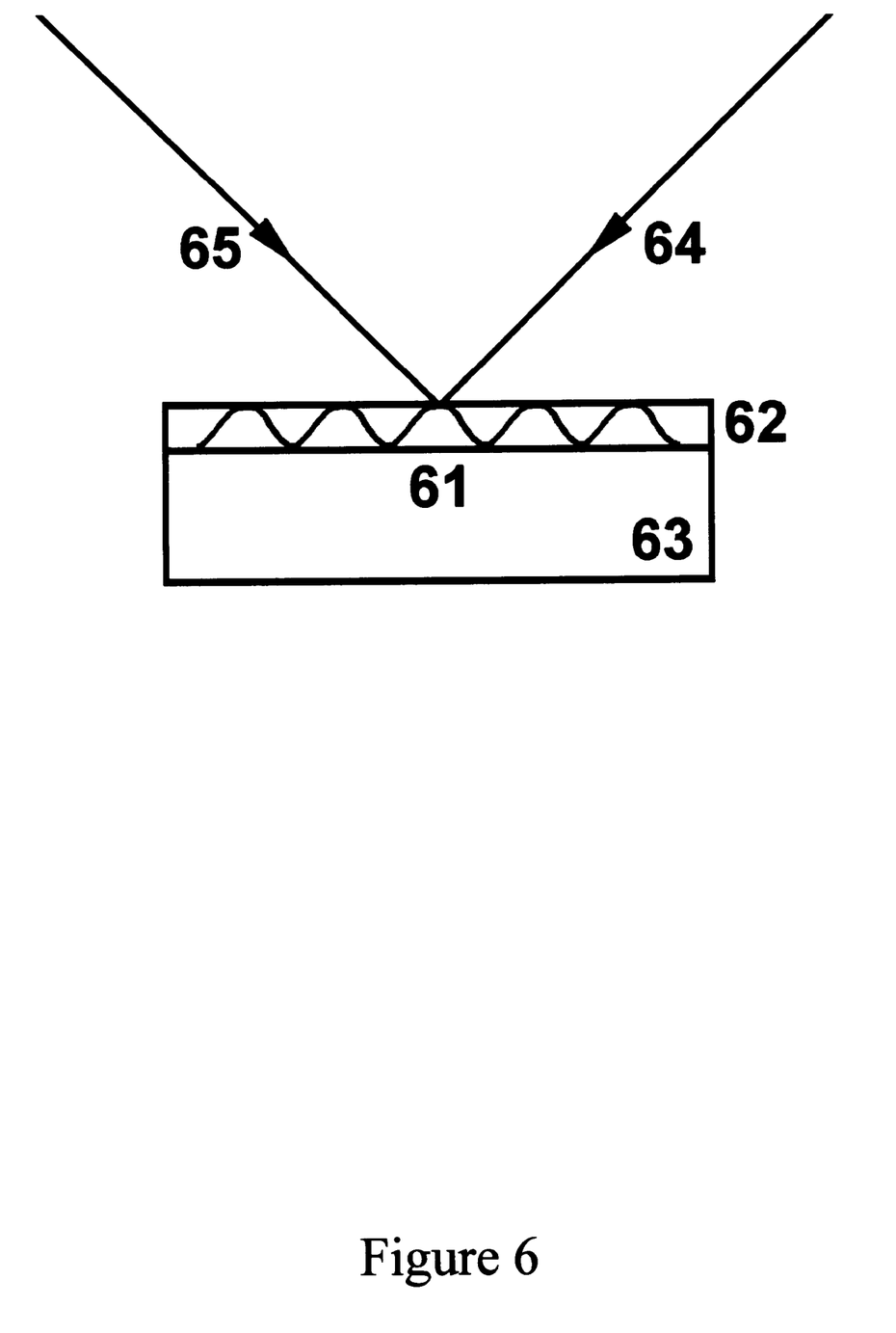
FIG. 6 shows a diffractive grating written in a modified region of the semiconductor with the help of two laser beams.

In the case when the modifying beam has a periodic intensity distribution, a diffractive grating can be created in the modified region. Such grating 61 can be written in modified region 62 on semiconductor substrate 63 as a result of interference of two laser beams 64 and 65, as shown in FIG. 6. An important advantage of the diffraction grating fabricated using this method is that it is a relief-free and purely phase grating introducing minimum loss in the system. This will considerably improve performance of the distributed feedback semiconductor lasers and other light emitting devices.

In one preferred embodiment, different masks and computer generated holograms can be used for laser writing the required refractive index profile. The computer generated holograms are well known state of the art technology. They allow high flexibility in generating almost arbitrary intensity distribution in the laser beam which can be converted in required refractive index profile using the described modification process. The proposed general technology provides a unique possibility for low cost fabrication of a broad class of semiconductor based active or passive devices, waveguide and diffractive optical elements using simple direct laser beam writing.

Figure 7:
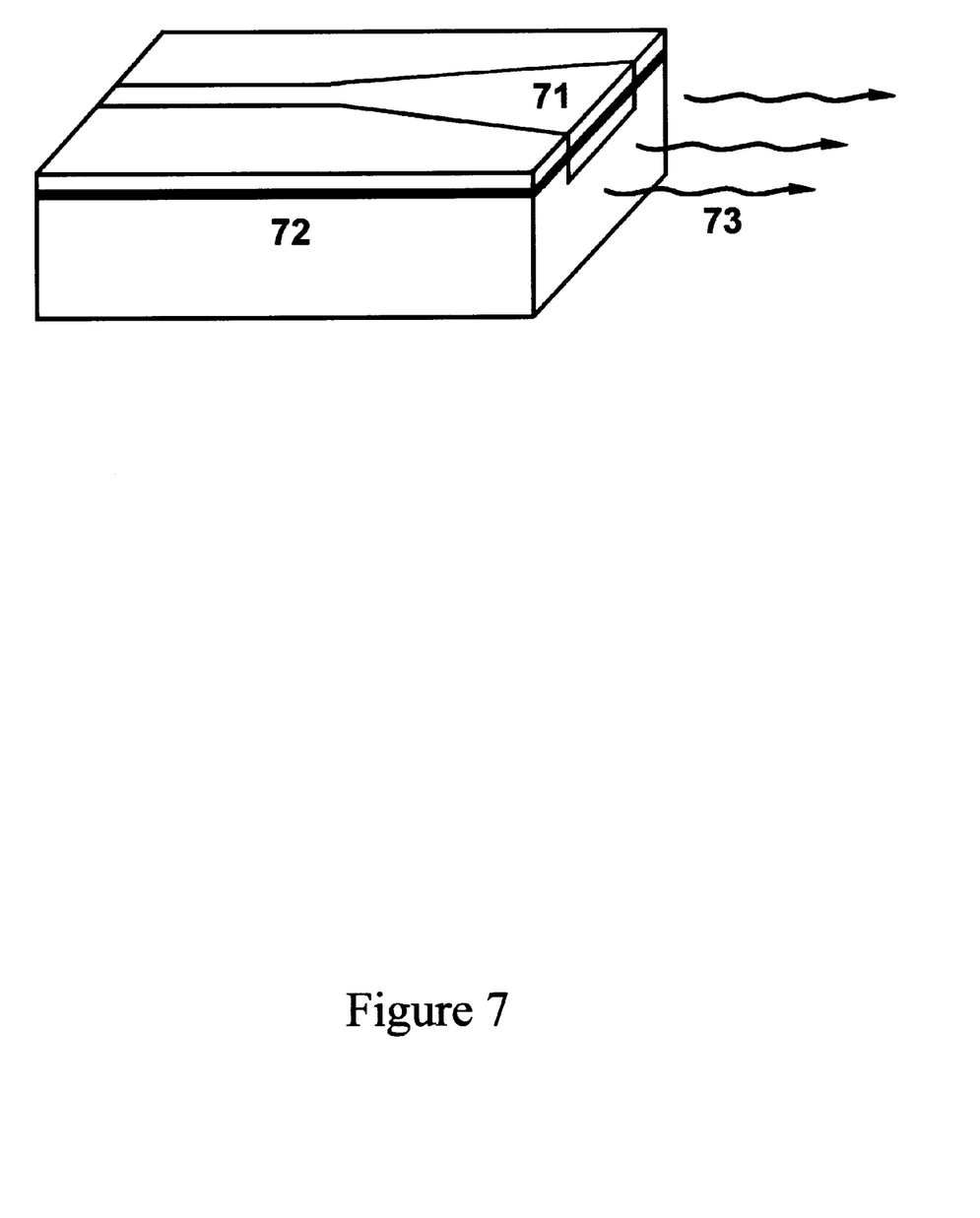
FIG. 7 shows a tapered waveguide structure created along the active region of a semiconductor light emitting device.

In the preferred embodiment of the present invention shown in FIG. 7, the refractive index variation in the system as a result of the photo-modification process is used for fabrication of longitudinally-inhomogeneous, for example tapering, waveguide structure 71 along active laser diode region 72 expanding the laser beam 73 and enlarging the stripe width preventing self-focusing ruining the beam quality. Fabrication of such tapering waveguides is a key technology for lasers based on MOPA structures.

Figure 8:
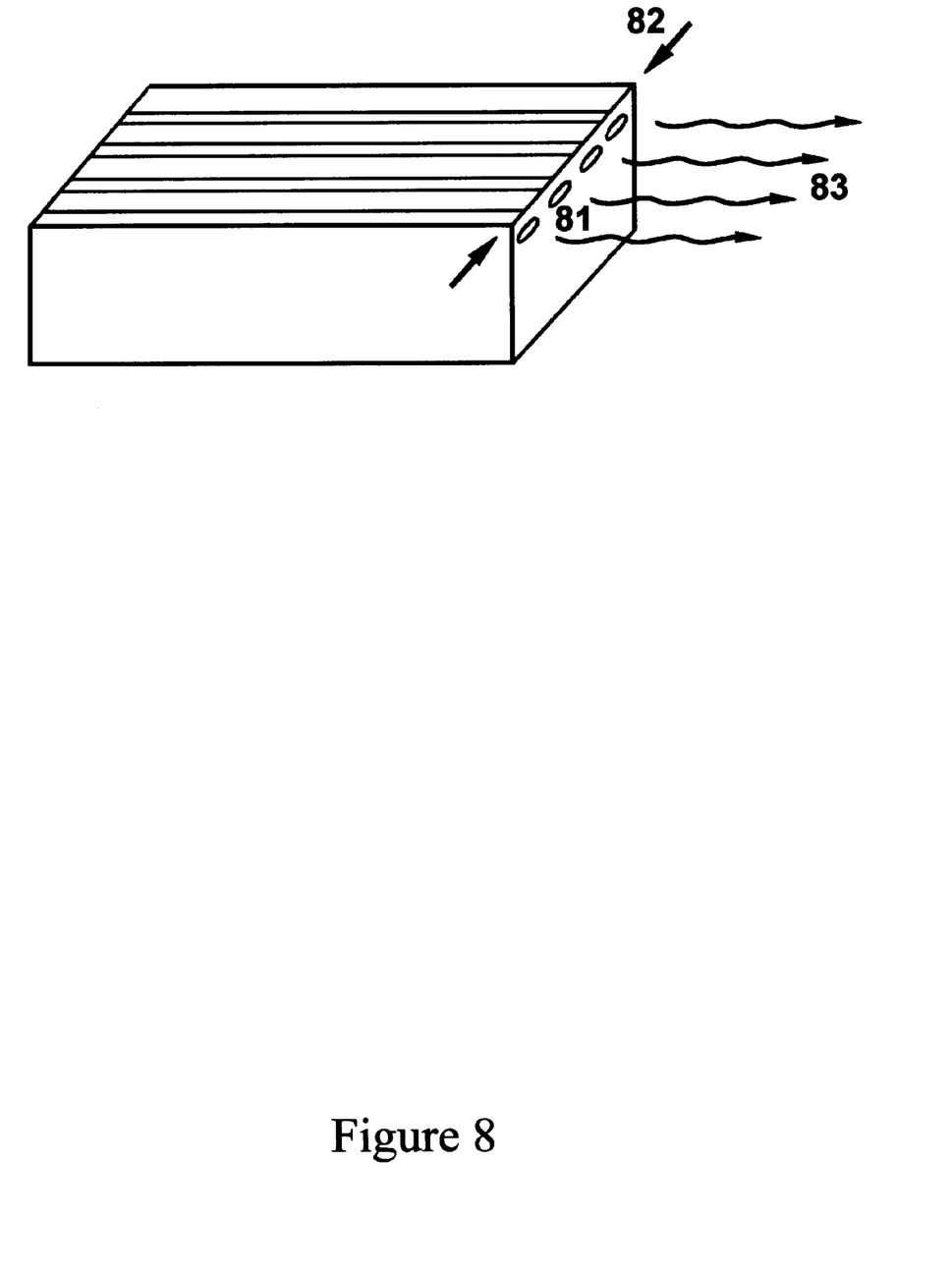
FIG. 8 illustrates optical isolation of individual emitters of a laser diode array.

In another preferred embodiment shown in FIG. 8, the modification process is used for simple and low costs fabrication of high-power diode laser linear bars and arrays based on AlGaAs, InGaAsP/InP or other semiconductor materials. The technology employs the effect of photo-modification of refractive index in the semiconductor material to provide sufficient optical isolation between individual array emitters 81 in order to suppress amplified spontaneous emission in the lateral dimension 82, while still having a large percentage of the emitting-edge radiate laser light 83 (large fill factor). To perform the optical isolation between individual emitters 81, refractive index of the semiconductor material is changed in such a way to create a light confining optical waveguide along each individual emitter 81. The waveguide structure can be written into the laser bar with the help of an external laser beam using appropriate mask as described above.

After sufficiently long time of modification of the semiconductor light emitting device, the clusters created in its near-surface region will be coupled together forming a continuous film. This film can be visually observed on the modified surface of the semiconductor. In one preferred embodiment of the present invention, the film created in the near-surface region of the light emitting device is used to improve electrical performance of the electrode supplying power to the device or instead of such an electrode. This method provides inexpensive and flexible technique for fabrication of electrical contacts in many photonic devices, improving their performance.

In still other preferred embodiment, the modification process is employed to decrease linewidth-enhancement factor of different active semiconductor materials, including AlGaAs or InGaAsP semiconductor materials, by significantly increasing the differential gain and decreasing differential index.

The linewidth enhancement factor is an important parameter characterizing the laser diode operation. The coupling between the gain and index in the laser diode that occurs through the carrier density can be described by a single parameter, α, called the linewidth-enhancement factor or the α-factor. It is defined as $$\alpha = -[dRe\{\chi(E,N)\}/dN]/[dIm\{\chi(E,N)\}/dN] \quad (1)$$

where χ(E,N) is the dielectric susceptibility, which depend on both E, the photon energy, and N, the carrier density. The linewidth-enhancement factor can also be expressed in terms of the differential gain and differential index as follows $$\alpha = -(4\pi/\gamma)[dn(E,N)/dN]/[dg(E,N)/dN] \quad (2)$$

where γ is the wavelength corresponding to the photon energy E.

Many unique properties of semiconductor diode lasers can be attributed to the strong coupling between the gain and index. The broadening of the spectral linewidth, dynamic-response characteristics, and waveguide properties of diode lasers and diode laser arrays can all be characterized in terms of α. For optimum mode discrimination and stability under high-power operation, it is desirable to minimize the linewidth-enhancement factor.

The linewidth-enhancement factor for double-heterostructure lasers typically ranges between about 4 and 8. For quantum-well lasers, however, lower values of α are found. This occurs because the differential gain in quantum-well structures is significantly larger than that of double heterostructures, while the differential index is comparable. Even lower values of α between 0.5 and 3 have been demonstrated in strained-layer quantum-well structures. Creation of microscopic clusters (quantum dots) in the active region of the semiconductor light emitting devices using described modification process will result in further decreasing the linewidth enhancement factor and in improving performance of these devices.

In one preferred embodiment the decrease in linewidth enhancement α-factor is used in high-power diffraction-limited laser diodes. When scaling diode lasers to higher power by simply enlarging the laser stripe width, a self-focusing effect causes the lasing mode to break-up into a number of mutually incoherent filaments thereby ruining the beam quality. A laser built with a low-alpha design will not suffer from this quality degradation, and thus wider lasers with higher power can be achievable. The laser will exhibit increased catastrophic optical damage threshold and saturation power.

In another preferred embodiment of the present invention, increasing the power, slope efficiency, thermal stability and decreasing threshold current of the semiconductor laser devices will be achieved by creating microscopic clusters (quantum dots) using the proposed technology. The mechanism of improving laser performance is described above in detail. The semiconductor modification process offers principally new technology for cluster formation in active light emitting devices considerably improving their performance. For example, the method of increasing the laser power and decreasing the threshold pump current by using low index coating on the laser mirrors is well established technology. The present invention, however, offers a principally new method of decreasing the refractive index in the region near the laser output interface (mirrors) by cluster formation using the described process of modification. The cluster formation in active region along the semiconductor light emitting device will also increase the output power, slope efficiency and decrease the threshold current due to improving quantum efficiency of the light emitting device.

Figure 9:
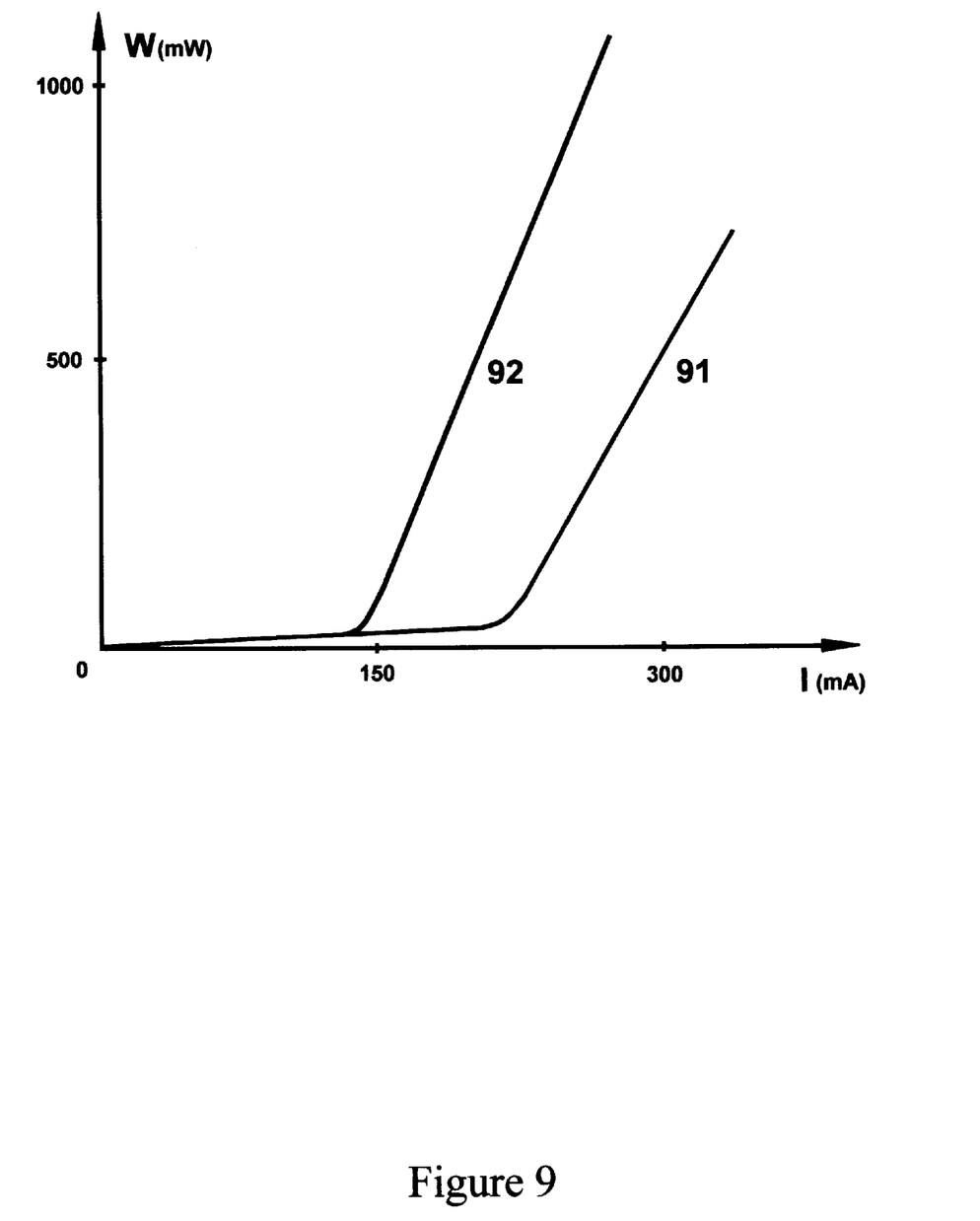
FIG. 9 schematically shows output power W as a function of pump current I for a semiconductor light emitting device before and after modification process.

FIG. 9 schematically shows typical dependence of power W generated by the semiconductor light emitting device on pump current I before 91 and after 92 the modification process in the most general case when the modification process increases power, slope efficiency and decreases threshold current. The characteristics of specific light emitting device after its modification may depart form those presented in FIG. 9. For example, slope of the curve after modification may remain the same if slope efficiency of the device was not changed. Result of the improvement in performance of specific light emitting device depends on regime of modification which should be carefully optimized.

In an additional preferred embodiment, the described process of modification of the semiconductor material and clusters formation is used to create regions exhibiting enhanced third order nonlinearity. It is known, that third order nonlinearity can be dramatically increased by formation of microscopic clusters in the semiconductor materials resulting in local enhancement of the electric field. The described modification process offers new low cost technology for creating nonlinear regions in active or passive semiconductor materials in the vicinity of their open surfaces accessible for dopants enhancing the process of modification.

The third order nonlinearity and photorefractive effect have many important applications in designing of different active or passive all-optical devices. They provide unique possibility of modulating a light beam by another light beam or self-modulating the light beam based on light induced change in refractive index of the device material. Using the described modification technology one can create the third order nonlinearities in different regions of the semiconductor device and employ them to perform different all-optical functions.

Figure 10:
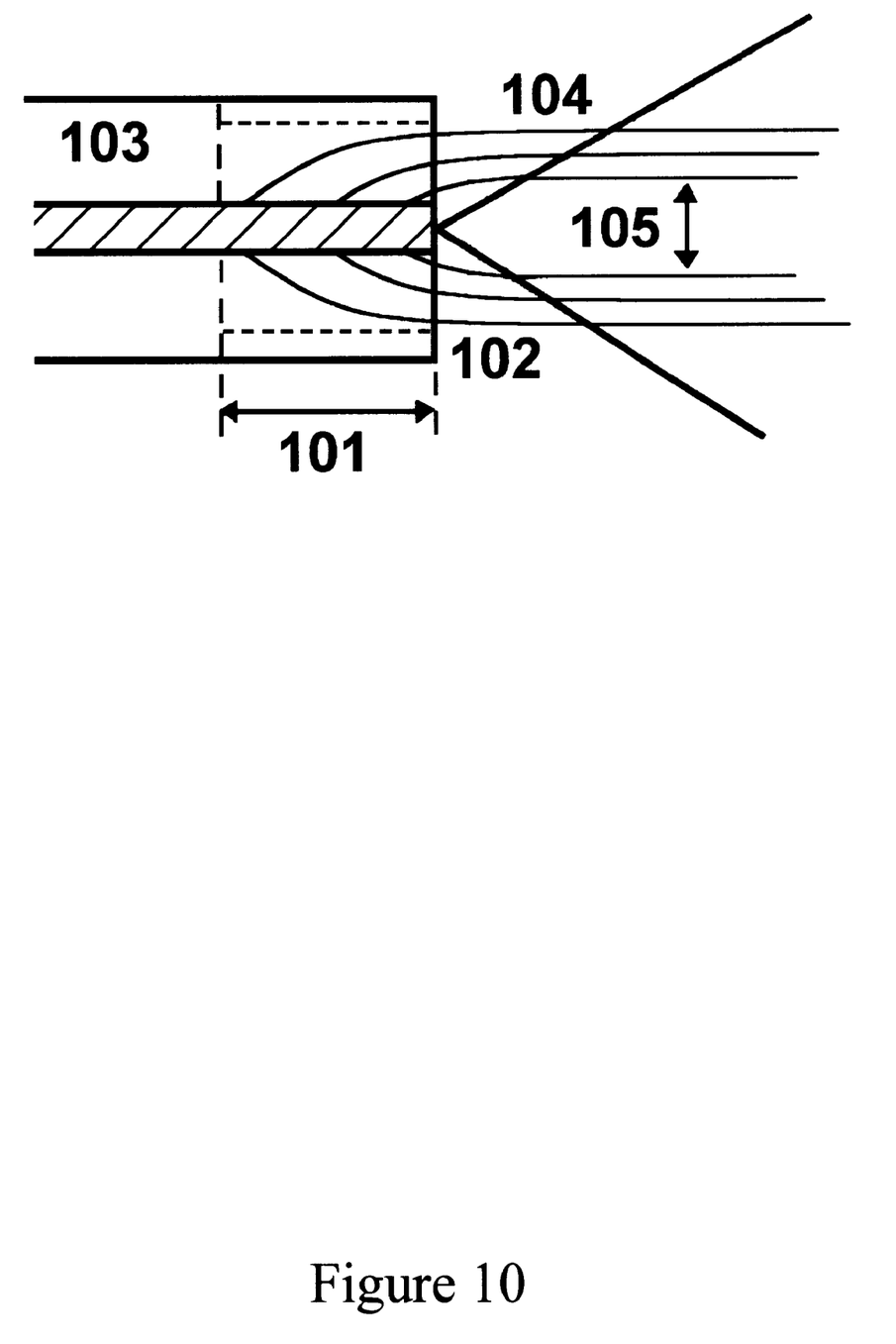
FIG. 10 illustrates a process of automatic self-correction of a laser diode beam in nonlinear region near output optical interface.

In one preferred embodiment shown in FIG. 10, the region with third order nonlinearity 101 is created directly near the output interface (mirror) 102 of the semiconductor laser device 103 to provide conditions for automatic self-correction of the laser beam 104 decreasing its angular divergence and astigmatism 105. After the process of modification is completed, the laser is switched on to generate light. The laser light beam changes refractive index in the nonlinear region 101 near the output interface trying to increase the beam width. The increase in beam width results in simultaneous decrease in its angular divergence or numerical aperture, since the product of the beam width and numerical aperture should remain constant. This nonlinear process eventually creates a complicated micro-optical lens system expanding the laser output beam, decreasing its angular divergence and astigmatism. The described method of collimating the diode laser beam is principally different from that claimed in U.S. patent application Ser. No. 08/749,814, since the laser beam correction is performed in nonlinear region of the semiconductor material after the modification process is completed.

The third order nonlinear coefficient in modified region, the change in refractive index as a result of modification, improving quantum efficiency of active semiconductor material and other improvements in the performance of a semiconductor light emitting device depend, of course, on size and orientation of the clusters. Changing the regime of modification by proper optimization of dopant concentration, light intensity, duration of the modification, pressure, temperature, applied electric field and other conditions allows to dramatically improve performance of different semiconductor light emitting devices.

This method provides an efficient means of improving performance of a broad class of semiconductor based devices such as laser diodes, diode laser arrays and bars, light emitting diodes, being pumped with an electric current, optical or other pump sources. As a general technology, the proposed method can also find many useful applications for improving performance of vertical cavity surface emitting lasers (VCSELs).

Having described preferred embodiments of the invention with reference to the accompanying drawings, it is to be understood that the invention is not limited to the precise embodiments, and that various changes and modifications may be effected therein by skilled in the art without departing from the scope or spirit of the invention as defined in the appended claims.

What is claimed is:

1. A method of improving performance of semiconductor light emitting devices, including laser diodes, diode laser bars, diode laser arrays, vertical cavity surface emitting lasers (VCSELs), light emitting diodes, having
 — at least one open surface with near-surface region
 — at least one output optical interface with near-interface region
 — at least one active region in said near-surface region,
 — at least one passive cladding region in said near-surface region,
by using a process of modification of the device's semiconductor material in at least one of said active region, passive cladding region or output optical interface, comprising the steps of:
 — bringing said at least one open surface or said at least one output optical interface in a direct contact with an appropriate acceptor, such as oxygen;
 — adsorption of said acceptor by said at least one open surface or said at least one output optical interface resulting in a band bending of said semiconductor materials in the near-surface region of the open surface or in the near-interface region of the output optical interface,
— creating clusters of interstitial materials in compound semiconductors, such as Ga in GaAs, Cd in CdS, In in InP, or clusters of defects in single-atomic semiconductors, such as Si, in said near-surface region of the open surface or in said near-interface region of the output optical interface as a result of a drift of the interstitial material or defects in the electric field induced by said band bending,
— continuing the process for the period of time required for improving performance of said semiconductor light emitting device.

2. A method of improving performance of semiconductor light emitting devices of claim 1, wherein:
— said at least one open surface or said at least one output optical interface of the semiconductor light emitting device is brought into a direct contact with a highly polar medium, such as water, having appropriate acceptors, such as oxygen or ions of some metals, dissolved in it; and
— said modification process is supported by illuminating said at least one open surface or said at least one output optical interface of the semiconductor light emitting device with at least one modifying optical beam at the wavelength not larger than the fundamental absorption wavelength of the device's semiconductor material.

3. A method of improving performance of semiconductor light emitting devices of claim 2, wherein said device's semiconductor material incorporates III–V or II–VI semiconductor materials, including compound semiconductors, such as GaAs, InP, CdS, CdTe, ZnSe, GaN and their alloys, and also single-atomic semiconductors, such as Si.

4. A method of improving performance of semiconductor light emitting devices of claim 2, wherein said process of modification is assisted with an external electrical field applied to said at least one open surface or said at least one output optical interface.

5. A method of improving performance of semiconductor light emitting devices of claim 2, wherein said process of modification is assisted with an external electrical field applied across said active region incorporating the region of semiconductor p-n junction.

6. A method of improving performance of semiconductor light emitting devices of claim 2, wherein said process of modification is continued for the period of time required for creating quantum dots in said at least one active region or said at least one passive cladding region.

7. A method of improving performance of semiconductor light emitting devices of claim 2, wherein said process of modification is continued for the period of time required for achieving a change of the refractive index of said device's semiconductor material in said at least one active region, said at least one passive cladding region or said at least one region of output optical interface, including large change of the refractive index required for achieving the anti-reflecting effect.

8. A method of improving performance of semiconductor light emitting devices of claim 7, wherein said change of the refractive index is used to fabricate at least one uniform or non-uniform waveguide structure along said light emitting device, possibly having tapering regions, and the waveguide structure is formed as a result of illuminating the device with said modifying optical beam having intensity distribution corresponding to said uniform or non-uniform waveguide structure.

9. A method of improving performance of semiconductor light emitting devices of claim 8, wherein said uniform or non-uniform waveguide structure is fabricated in laser diode bars or arrays in order to optically isolate individual light emitters and suppress amplified spontaneous emission in the lateral dimension.

10. A method of improving performance of semiconductor light emitting devices of claim 2, wherein said process of modification is continued for the period of time required for decreasing linewidth enhancement factor, and increasing catastrophic optical damage threshold and saturation power of said semiconductor light emitting devices.

11. A method of improving performance of semiconductor light emitting devices of claim 2, wherein said process of modification is continued for the period of time required for increasing power, slope efficiency and decreasing threshold current of said semiconductor light emitting device.

12. A method of improving performance of semiconductor light emitting devices of claim 11, wherein said process of modification is applied to said at least one active region or said at least one passive cladding region before the device is connected to a heat sink and these regions are still accessible.

13. A method of improving performance of semiconductor light emitting devices of claim 11, wherein said process of modification is applied to the region of said at least one output optical interface.

14. A method of improving performance of semiconductor light emitting devices of claim 2, wherein said process of modification is continued for the period of time required for increasing thermal stability of the semiconductor light emitting device.

15. A method of improving performance of semiconductor light emitting devices of claim 2, wherein said process of modification is continued for the period of time required for enhancing third order nonlinearity in said at least one active region, said at least one passive cladding region or in the region of said at least one output optical interface.

16. A method of improving performance of semiconductor light emitting devices of claim 2, wherein said process of modification is continued for the period of time required for enhancing third order nonlinearity or photorefractive properties of the semiconductor material in said at least one active region, said at least one passive cladding region or in the region of said at least one output interface in order to achieve all-optical functions of light modulation by an external light or self-modulation of the light, including all-optical logic switching, Q-switching, phase conjugation, bistable memory.

17. A method of improving performance of semiconductor light emitting devices of claim 2, resulting in automatic self-correction of the beam generated by the semiconductor light emitting device, reducing its angular divergence and astigmatism, wherein said process of modification is performed in the region of said at least one output optical interface, comprising additional steps of:
— switching on said light emitting device to generate light after said process of modification is completed; and
— continuing the light generation process until said automatic self-correction of the beam is completed.

18. A method of improving performance of semiconductor light emitting devices of claim 7, wherein said change of the refractive index forms at least one diffractive grating in said light emitting device, possibly supporting a feedback in the system, and said grating is formed as a result of illuminating the device with said modifying optical beam having a periodic intensity distribution corresponding to the grating structure, including the periodic intensity distribution created by an interference pattern of two laser beams.

19. A method of improving performance of semiconductor light emitting devices of claim 8, wherein said intensity distribution is formed by illuminating the device with said modifying optical beam through a mask or using a computer generated hologram.

20. A method of improving performance of semiconductor light emitting devices of claim 2, wherein said modification process is continued for the period of time required for coupling said clusters together and forming at least one electrical contact improving performance of an electrode connected to the device.

* * * * *